(12) United States Patent
Mecheri Ravisubramanian et al.

(10) Patent No.: US 11,215,677 B2
(45) Date of Patent: Jan. 4, 2022

(54) WIRE CONNECTOR FOR VEHICLE

(71) Applicants: Hyundai Motor Company, Seoul (KR); Kia Motors Corporation, Seoul (KR)

(72) Inventors: Gowri Shankar Mecheri Ravisubramanian, Tamilnadu (IN); Sushant Gurjar, Chhattisgarh (IN)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 51 days.

(21) Appl. No.: 16/263,544

(22) Filed: Jan. 31, 2019

(65) Prior Publication Data

US 2020/0182920 A1 Jun. 11, 2020

(30) Foreign Application Priority Data

Dec. 11, 2018 (IN) .............................. 201811046830

(51) Int. Cl.
| | |
|---|---|
| *G01R 31/00* | (2006.01) |
| *G01R 31/50* | (2020.01) |
| *H01R 13/422* | (2006.01) |
| *G01R 19/15* | (2006.01) |
| *G01R 31/42* | (2006.01) |
| *G01R 31/52* | (2020.01) |

(Continued)

(52) U.S. Cl.
CPC ............. *G01R 31/50* (2020.01); *G01R 19/15* (2013.01); *G01R 19/2513* (2013.01); *G01R 31/006* (2013.01); *G01R 31/088* (2013.01); *G01R 31/2813* (2013.01); *G01R 31/40* (2013.01); *G01R 31/42* (2013.01); *G01R 31/52* (2020.01); *H01R 13/422* (2013.01); *H01R 2201/26* (2013.01)

(58) Field of Classification Search
CPC ...... G01R 31/50; G01R 31/006; G01R 19/15; G01R 31/66; G01R 31/54; G01R 31/69; G01R 31/67; G01R 31/68; G01R 31/52; G01R 31/42; G01R 31/40; G01R 19/2513; G01R 31/088; G01R 31/2813; G01R 1/0416; H01R 13/422; H01R 2201/26; H01R 13/111; H01R 13/506; H01R 2201/20; H01R 13/4362; H01R 13/641; H01R 13/66; H01R 13/665; H01R 13/64; H01R 13/02; H01R 24/005; H01R 13/04; H01R 13/10; B60R 16/02
USPC .................................................. 324/500–556
See application file for complete search history.

(56) References Cited

U.S. PATENT DOCUMENTS 5,562,486 A * 10/1996 Saijo et al. ............... H01R 3/00
5,848,912 A * 12/1998 Okabe ...................... H01R 3/00
(Continued)

FOREIGN PATENT DOCUMENTS

| CN | 1204167 A | 1/1999 |
|---|---|---|
| CN | 201327975 Y | 10/2009 |

*Primary Examiner* — Raul J Rios Russo
(74) *Attorney, Agent, or Firm* — Mintz Levin Cohn Ferris Glovsky and Popeo, P.C.; Peter F. Corless

(57) ABSTRACT

A wire connector for a vehicle may include: a male connector having male terminals; a female connector having female terminals into which the male terminals of the male connector are inserted; and a circuit portion through which a current supplied by a continuity tester flows. The continuity tester can detect whether the male connector and the female connector are assembled without error.

7 Claims, 9 Drawing Sheets

(51) Int. Cl.
    *G01R 31/40*           (2020.01)
    *G01R 19/25*           (2006.01)
    *G01R 31/08*           (2020.01)
    *G01R 31/28*           (2006.01)

(56) References Cited

U.S. PATENT DOCUMENTS

| | | | | |
|---|---|---|---|---|
| 5,997,344 | A * | 12/1999 | Shinozaki | H01R 3/00 |
| 10,033,126 | B2 * | 7/2018 | Sekino et al. | |
| 2006/0284638 | A1 * | 12/2006 | Gale | G01R 31/26 |
| 2007/0202753 | A1 * | 8/2007 | Murakami | H01R 13/514 |
| | | | | 439/701 |
| 2008/0200075 | A1 * | 8/2008 | Murakami | H01R 13/6658 |
| | | | | 439/701 |
| 2009/0045817 | A1 * | 2/2009 | Savicki et al. | G01R 31/28 |
| 2017/0179631 | A1 * | 6/2017 | Feldchtein | H01R 4/50 |
| 2019/0140381 | A1 * | 10/2019 | Matsushita et al. | |

\* cited by examiner

WIRE CONNECTOR FOR VEHICLE

CROSS-REFERENCE TO RELATED APPLICATION

This application claims priority to and the benefit of Indian Patent Application No. 201811046830, filed on Dec. 11, 2018, the entire contents of which are incorporated herein by reference.

BACKGROUND OF THE DISCLOSURE

(a) Technical Field

The present disclosure relates to a vehicle, and more particularly, to a wire connector for a vehicle.

(b) Description of the Related Art

A wide range of electric devices are installed in the body of modern vehicles. Electric power of a battery of the vehicle is supplied to the electric devices through a wiring harness, which is electrically connected using a connector.

Generally speaking, a connector is a component that is used to electrically couple one circuit to another. The connector includes a female connector and a male connector that are made of a resin material. A protrusion terminal made of a metal material and an insertion terminal corresponding to the protrusion terminal are formed inside the connector.

The wiring harness includes wire cables that supplies power to each part of the vehicle, and is connected to a switch and a fuse box. The wiring harness corresponding to an electrical wiring device for the vehicle includes a plurality of wire bundles and may include a wire for supplying electric power as well as a communication wire for performing a communication function.

The electric devices may be electrically connected to other electric devices and/or a power supply source through the cables or the wiring harness. However, if the wiring harness is directly connected to the electric device or the power supply source, the connection operation becomes complicated and requires significant amounts of time to complete. Thus, the connection operation is usually performed using the connector.

The above information disclosed in this Background section is only for enhancement of understanding of the background of the disclosure, and therefore, it may contain information that does not form the related art.

SUMMARY OF THE DISCLOSURE

The present disclosure has been made in an effort to provide a wire connector for a vehicle capable of detecting whether a male connector and a female connector are properly assembled.

According to embodiments of the present disclosure, a wire connector for a vehicle may include: a male connector having male terminals; a female connector having female terminals into which the male terminals of the male connector are inserted; and a circuit portion through which a current supplied by a continuity tester flows. The continuity tester can detect whether the male connector and the female connector are assembled without error.

An end portion of the circuit portion may be in contact with a boundary surface located between an angular protrusion portion formed at an end portion of the male connector and a lock portion that is fixed to the angular protrusion portion and is formed at an end portion of the female connector, the end portion of the circuit portion may be connected to a test terminal of the male connector that is disposed at the boundary surface and applies a voltage to the circuit portion to generate the current supplied by the continuity tester, the circuit portion may include transformation portions in contact with the male terminals of the male connector, and the transformation portions of the circuit portion may be configured to be transformed so that the current supplied by the continuity tester flows through the circuit portion when the male terminals of the male connector are maximally inserted into the female terminals of the female connector.

Each of the transformation portions may be a C-shaped wire.

The circuit portion may include a connection portion that is detached from the circuit portion after a test is performed, and the test may allow the current supplied by the continuity tester to flow through the circuit portion.

The male connector may include test terminals that allow the current supplied by the continuity tester to flow through the circuit portion after the male connector and the female connector are assembled.

The current supplied by the continuity tester may flow through the circuit portion when the male terminals of the male connector are maximally inserted into the female terminals of the female connector.

The circuit portion may include transformation portions in contact with the male terminals of the male connector, and the transformation portions of the circuit portion may be transformed by the male terminals of the male connector so that the current supplied by the continuity tester flows through the circuit portion when the male terminals of the male connector are maximally inserted into the female terminals of the female connector.

The male connector may include an end portion having an angular protrusion portion fixed to a lock portion of the female connector.

The circuit portion may be connected to the continuity tester through test terminals of the male connector after the male connector and the female connector are assembled, the continuity tester may detect the current flowing in the circuit portion by applying a voltage to the circuit portion via the test terminals of the male connector, and the continuity tester may determine that the wire connector is assembled without error when the current is detected.

The wire connector for a vehicle according to embodiments of the present disclosure may detect or determine whether the male connector and the female connector are properly and completely assembled without error. Further, the wire connector may prevent malfunction of an electrical device of the vehicle due to assembly error.

BRIEF DESCRIPTION OF THE DRAWINGS

A brief description of the drawings will be provided to more sufficiently understand the drawings which are used in the detailed description of the present disclosure.

Figure 1:
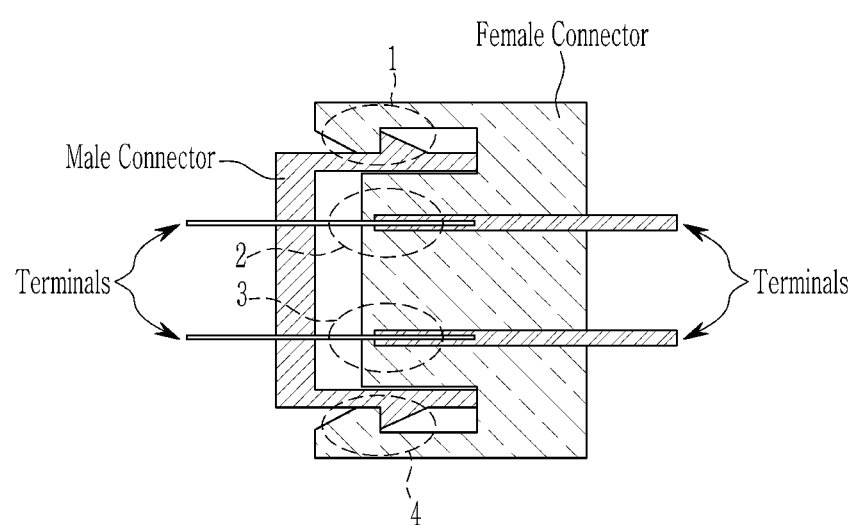
FIG. 1 is a cross-sectional view illustrating an example of a wiring connector for a vehicle.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

In order to sufficiently understand the present disclosure and the object achieved by embodying the present disclosure, the accompanying drawings illustrating exemplary embodiments of the present disclosure and contents described in the accompanying drawings are to be referenced.

Hereinafter, the present disclosure will be described in detail by describing exemplary embodiments of the present disclosure with reference to the accompanying drawings. In describing the present disclosure, well-known configurations or functions will not be described in detail since they may unnecessarily obscure the gist of the present disclosure. Throughout the accompanying drawings, the same reference numerals will be used to denote the same components.

Terms used in the present specification are only used in order to describe specific exemplary embodiments rather than limiting the present disclosure. Singular forms are to include plural forms unless the context clearly indicates otherwise. It will be further understood that the terms "include" or "have" used in the present specification specify the presence of features, numerals, steps, operations, components, or parts mentioned in the present specification, or a combination thereof, but do not preclude the presence or addition of one or more other features, numerals, steps, operations, components, parts, or a combination thereof.

Throughout this specification and the claims that follow, when it is described that an element is "coupled" to another element, the element may be "directly coupled" to the other element or "electrically or mechanically coupled" to the other element through a third element.

Unless defined otherwise, it is to be understood that the terms used in the present specification including technical and scientific terms have the same meanings as those that are generally understood by those skilled in the art. It must be understood that the terms defined by the dictionary are identical with the meanings within the context of the related art, and they should not be ideally or excessively formally defined unless the context clearly dictates otherwise.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Referring now to the presently disclosed embodiments, FIG. 1 is a cross-sectional view illustrating an example of a wiring connector for a vehicle.

As shown in FIG. 1, the wiring connector for the vehicle includes a male connector and a female connector. As indicated by reference numerals 1, 2, 3, and 4, a locking portion of the male connector may be coupled or fixed to a locking portion of the female connector and male terminals of the male connector may be inserted into female terminals of the female connector so that the male connector and the female connector are assembled.

Figure 2:
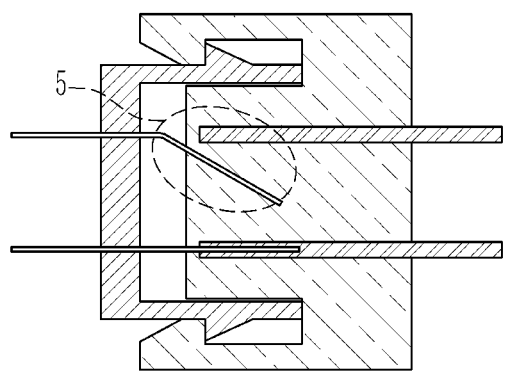
FIG. 2 is a cross-sectional view showing assembly error between a male connector and a female connector shown FIG. 1.

FIG. 2 is a cross-sectional view showing assembly error between the male connector and the female connector shown FIG. 1.

As shown in FIG. 2, when the male and female connectors are assembled, one male terminal of the male connector may bend without being inserted into a female terminal of the female connector, as indicated by a reference numeral 5.

Figure 3:
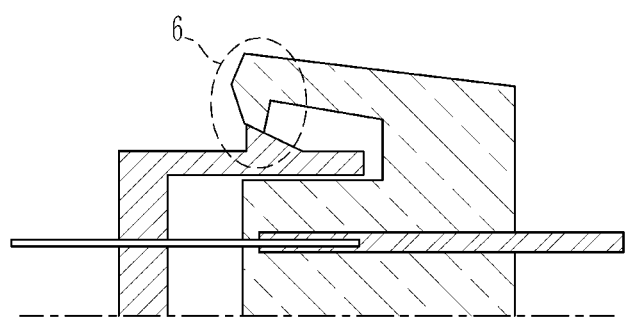
FIG. 3 is a cross-sectional view showing a case where the male connector and female connector shown in FIG. 1 are not fully assembled.

FIG. 3 is a cross-sectional view showing a case where the male connector and female connector shown in FIG. 1 are not fully assembled.

As shown in FIG. 3, as indicated by a reference numeral 6, the locking portion of the male connector may not be fully coupled to the locking portion of the female connector so that the male and female connectors is assembled. When the locking portion of the male connector is not fully coupled to the locking portion of the female connector, vibration generated when the vehicle travels on a rough road may detach the male and female connectors.

Figure 4:
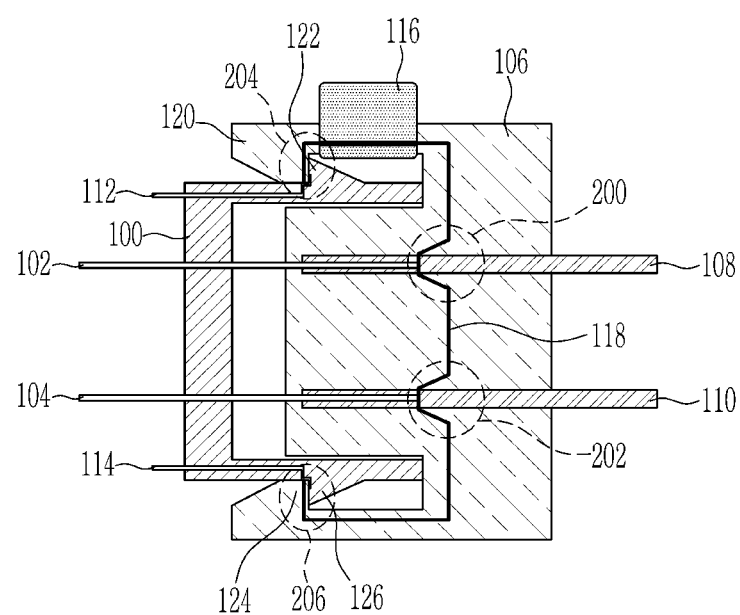
FIG. 4 is a cross-sectional view illustrating a wire connector for a vehicle according to embodiments of the present disclosure.
Figure 5:
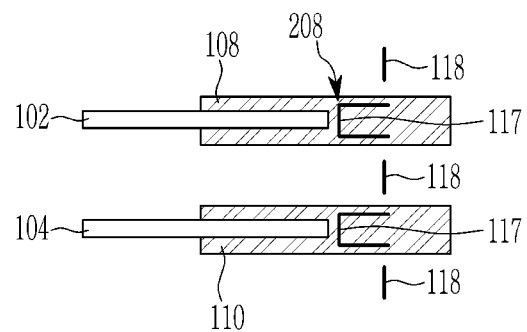
FIGS. 5 and 6 are views illustrating a circuit portion shown in FIG. 4.
Figure 6:
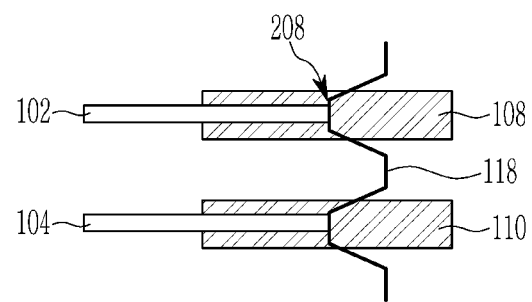
Figure 7:
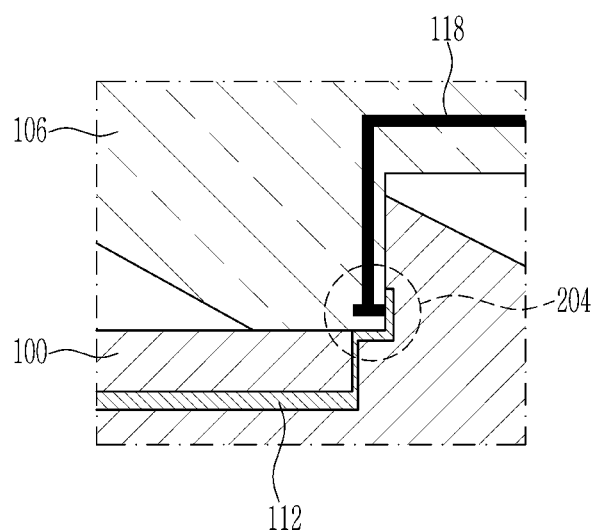
FIG. 7 is a view illustrating a portion indicated by a reference numeral 204 in FIG. 4.
Figure 8:
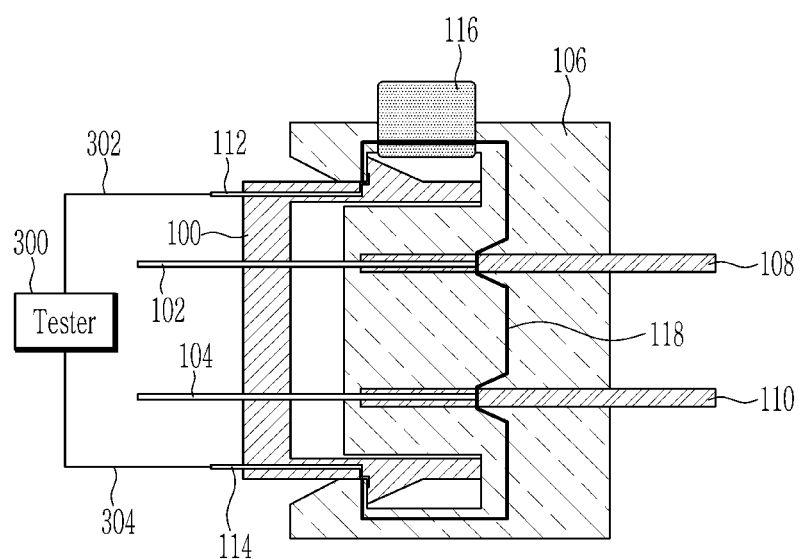
FIG. 8 is a view explaining a case where a continuity tester is connected to a vehicle wire connector shown in FIG. 4.
Figure 9:
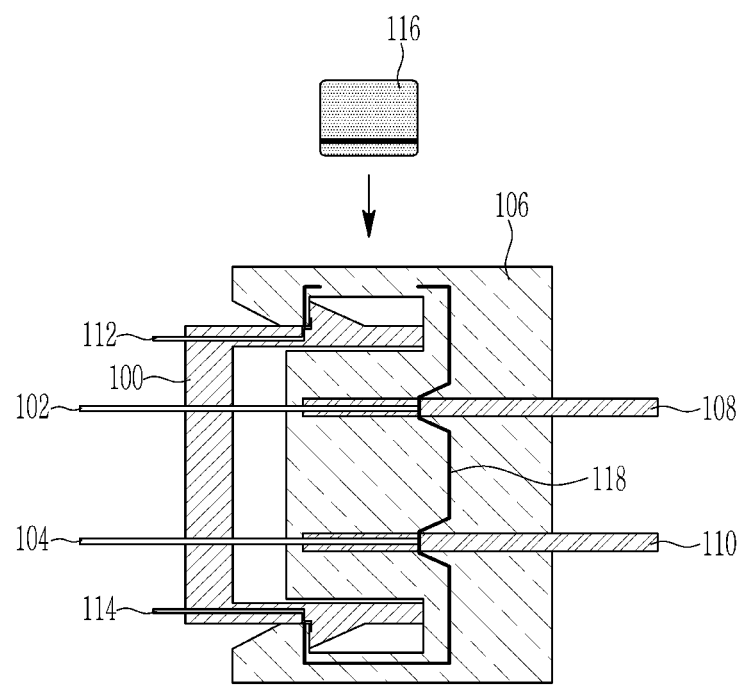
FIG. 9 is a view explaining a case where a connection portion is disconnected from the vehicle wire connector shown in FIG. 4.

FIG. 4 is a cross-sectional view illustrating a wire connector for a vehicle according to embodiments of the present disclosure. FIGS. 5 and 6 are views illustrating a circuit portion shown in FIG. 4. FIG. 7 is a view illustrating a portion indicated by a reference numeral 204 in FIG. 4. FIG. 8 is a view explaining a case where a continuity tester is connected to a vehicle wire connector shown in FIG. 4. FIG. 9 is a view explaining a case where a connection portion is detached from the vehicle wire connector shown in FIG. 4.

Referring to FIGS. 4 to 9, the wire connector for the vehicle may include a male connector 100, a female connector 106 having female terminals (e.g., terminal insertion portions) 108 and 110 into which male terminals 102 and 104 of the male connector 100 are inserted, and the circuit portion (or an integrated circuit portion) 118 through which an electric current supplied by the continuity tester 300, which detects or determines whether a full assembly (or a complete assembly) of the male connector 100 and the female connector 106, flows, that is, whether the male connector 100 and the female connector 106 are assembled without error. The circuit portion 118 may be disposed within the female connector 106 and, for example, may include a conductor.

For example, end portions of the male terminals 102 and 104 may be connected to wires connected to an electric device (e.g., an audio device) of the vehicle or a wiring harness of the vehicle. End portions of the female terminals 108 and 110 may be connected to a wiring harness of the vehicle. For example, the male terminals 102 and 104 which are disposed in a body of the male connector 100 and the female terminals 108 and 110 which are disposed in a body of the female connector 106 may be conductors.

The male connector 100 may be coupled to the female connector 106 through angular protrusion portions 122 and 126 of the male connector, lock portions 120 and 124 of the female connector, and the female terminals 108 and 110 into which the male terminals 102 and 104 of the male connector are inserted. The male connector 100 may include an end portion having an angular protrusion portion 122 or 126 fixed to a lock portion 120 or 124 of the female connector 106. The male connector 100 may include test terminals 112 and 114 that allow the electric current supplied by the continuity tester 300 to flow through the circuit portion 118 after the male connector and the female connector 106 are assembled.

As indicated by reference numerals 204 and 206 of FIG. 4 and shown in FIG. 7, an end portion of the circuit portion 118 may be in contact with (or connected to) a boundary surface located between the angular protrusion portion 122 or 126 formed at the end portion of the male connector 100 and the lock portion 120 or 124 that is fixed to the angular protrusion portion and is formed at an end portion of the female connector 106. The end portion of the circuit portion 118 may be connected to a test terminal 112 or 114 of the male connector 100 that is disposed at the boundary surface and applies a voltage to the circuit portion 118 to generate the current supplied by the continuity tester 300.

As indicated by reference numerals 200 and 202 of FIG. 4 and shown in FIGS. 5 and 6, when the male terminals 102 and 104 of the male connector 100 are maximally inserted into the female terminals 108 and 110, transformation portions 117 of the circuit portion 118 may be contacted with the male terminals of the male connector to be transformed so that the electric current supplied by the continuity tester 300 flows through the circuit portion 118. A reference numeral 208 of FIGS. 5 and 6 may indicate a position at which the male terminals 102 and 104 of the male connector 100 are maximally inserted into the female terminals 108 and 110. For example, a transformation portion 117 may be a convex shape conductor or a C-shaped wire.

Referring next to FIG. 8, the continuity tester 300 may determine whether an electrical path or an electric circuit is established between two points. In more detail, after the male connector 100 and the female connector 106 are assembled, the continuity tester 300 may detect or measure an electric current flowing in the circuit portion 118 by applying a voltage to the circuit portion via conducting wires 302 and 304 connected to the test terminals 112 and 114 of the male connector 100. When the current is detected, the continuity tester 300 may determine that the wire connector for the vehicle is assembled completely or without assembly error. When no current is detected, the continuity tester 300 may determine that the wire connector for the vehicle is not fully assembled.

Referring next to FIG. 9, in order to prevent a short circuit from being formed in the vehicle wire connector according to embodiments of the present disclosure, the circuit portion 118 may include a connection portion 116 which is separated from the circuit portion after a test, which allows the electric current supplied by the continuity tester 300 to flow through the circuit portion, is performed.

For example, the connection portion 116 may be a member of a rectangular shape synthetic resin material including a linear conductor connected to the conductor of the circuit portion 118.

As set forth above, exemplary embodiments have been disclosed in the accompanying drawings and the specification. Herein, specific terms have been used, but are just used for the purpose of describing the present disclosure and are not used for qualifying the meaning or limiting the scope of the present disclosure, which is disclosed in the appended claims. Therefore, it will be understood by those skilled in the art that various modifications and equivalent exemplary embodiments are possible from the present disclosure. Accordingly, the actual technical protection scope of the present disclosure must be determined by the spirit of the appended claims.

DESCRIPTION OF SYMBOLS

100: male connector
106: female connector
116: connection portion
117: transformation portion
118: circuit portion

What is claimed is:

1. A wire connector for a vehicle comprising:
a male connector having male terminals;
a female connector having female terminals into which the male terminals of the male connector are inserted; and
a circuit portion through which a current supplied by a continuity tester flows,
wherein the continuity tester detects whether the male connector and the female connector are assembled without error,
wherein an end portion of the circuit portion is in contact with a boundary surface located between an angular protrusion portion formed at an end portion of the male connector and a lock portion that is fixed to the angular protrusion portion and is formed at an end portion of the female connector,
wherein the end portion of the circuit portion is connected to a test terminal of the male connector that is disposed at the boundary surface and applies a voltage to the circuit portion to generate the current supplied by the continuity tester,
wherein the circuit portion includes a plurality of C-shaped wires in contact with the male terminals of the male connector, and
wherein the C-shaped wires of the circuit portion are configured to be transformed so that the current supplied by the continuity tester flows through the circuit portion when the male terminals of the male connector are maximally inserted into the female terminals of the female connector.

2. The wire connector of claim 1, wherein
the circuit portion includes a connection portion that is detached from the circuit portion after a test is performed, and
the test allows the current supplied by the continuity tester to flow through the circuit portion.

3. The wire connector of claim 1, wherein the male connector includes test terminals that allow the current supplied by the continuity tester to flow through the circuit portion after the male connector and the female connector are assembled.

4. The wire connector of claim 1, wherein the current supplied by the continuity tester flows through the circuit portion when the male terminals of the male connector are maximally inserted into the female terminals of the female connector.

5. The wire connector of claim 1, wherein:
the circuit portion includes the C-shaped wires in contact with the male terminals of the male connector, and
the C-shaped wires of the circuit portion are transformed by the male terminals of the male connector so that the current supplied by the continuity tester flows through the circuit portion when the male terminals of the male connector are maximally inserted into the female terminals of the female connector.

6. The wire connector of claim 1, wherein the male connector includes an end portion having an angular protrusion portion fixed to a lock portion of the female connector.

7. The wire connector of claim 1, wherein
the circuit portion is connected to the continuity tester through test terminals of the male connector after the male connector and the female connector are assembled,
the continuity tester detects the current flowing in the circuit portion by applying a voltage to the circuit portion via the test terminals of the male connector, and
the continuity tester determines that the wire connector is assembled without error when the current is detected.

* * * * *